United States Patent

Niemirovich

[15] 3,707,039

[45] Dec. 26, 1972

[54] TERMINATION ARRANGEMENT FOR WIRE DEVICES

[72] Inventor: John R. Niemirovich, Royersford, Pa.

[73] Assignee: Sperry Rand Corporation, Americas, N.Y.

[22] Filed: June 3, 1970

[21] Appl. No.: 42,942

[52] U.S. Cl. ....................29/625, 174/68.5
[51] Int. Cl. ....................H05k 3/00
[58] Field of Search ................29/625, 626; 174/68.5

[56] References Cited

UNITED STATES PATENTS

| | | | |
|---|---|---|---|
| 3,350,250 | 10/1967 | Sanz et al. | 174/68.5 UX |
| 3,566,005 | 2/1971 | Shaheen | 29/625 X |
| 3,134,953 | 5/1964 | Eisler | 29/625 UX |

*Primary Examiner*—R. Spencer Annear
*Attorney*—Charles C. English, Rene A. Kuypers and William E. Cleaver

[57] ABSTRACT

An arrangement for terminating elements such as plated wire memory devices ( (which have the size of a human hair), wire resistor elements, or similar devices for connection to external circuitry. The arrangement is also suitable for coupling similar devices which are on different planes and are oriented either in parallel or at different angles. The arrangement includes positioning slots which serve as connecting lands as well as non-conducting walls to prevent short circuits between adjacent wires when molten solder is applied to the end of the wire.

6 Claims, 5 Drawing Figures

INVENTOR
JOHN NIEMIROVICH, JR.
BY Rene a. Kuypers
ATTORNEY

INVENTOR
JOHN NIEMIROVICH, JR.
BY Rene A. Kuypers
ATTORNEY

TERMINATION ARRANGEMENT FOR WIRE DEVICES

BACKGROUND OF THE INVENTION

The field of this invention is related to that of electronic packaging and in particular is related to the field of electronic packaging for use with wire elements such as plated wire memory elements or wire resistor elements.

In the known prior art relative to this invention it has been the practice to terminate a plated wire memory element, for example, on a flat, photo-fabricated termination board which in turn is adapted for connection to the outside world by pin connections. In the present state of the art, plated wires have a diameter of 5 mils (i.e., five-thousandths of an inch) and are mounted on 30-mil centers (i.e., from wire center to wire center) or 33 wires per inch. With the type of density that is being discussed there is only 25-mil separation between wires. It can therefore be appreciated that to solder quickly, reliably and without short-circuiting adjacent wires together, extreme difficulty is encountered due to the movement of the wires on the prior art flat termination board and further because of the ease with which molten solder flows to an adjacent position.

The above-described difficulties will be further compounded from the fact that the present state of the art is moving in the direction of still smaller diameter plated wire memory elements. These wires are on the order of 2-mils diameter and are to be put on 10-mil centers or 100 wires to the inch. Accordingly, it can be seen that to achieve the packing density that is being contemplated it is necessary to terminate the wires easily, economically and without shorting adjacent wires.

SUMMARY OF THE INVENTION

The present invention provides a termination arrangement wherein adjacent insulating walls are formed to provide a slot or land to receive wire elements such as a memory wire or resistor wire. The land is formed by copper plating over a film of gold, which in turn has been plated onto a copper substrate in the appropriate pattern. The wire is positioned on the land and later soldered or welded into place. When solder is used as the fixing agent, its movement in the molten state is impeded by the insulating walls and therefore there is no likelihood of short-circuiting adjacent wires. The slot also performs the function of properly positioning the wire so that it does not move when the soldering or welding function is being performed. As a consequence of the above, the packing density of wires can be greatly increased. This is of great significance because of the requirement in the electronic arts to place more and more components into a smaller area.

It is therefore an object of this invention to increase the packing density of wire elements and in particular, it is an object of this invention to increase the packing density of plated wire memory elements and resistor wire elements. It is still a further object of this invention to provide an interconnection means for high density applications.

DESCRIPTION OF THE PREFERRED EMBODIMENTS

Figure 1:
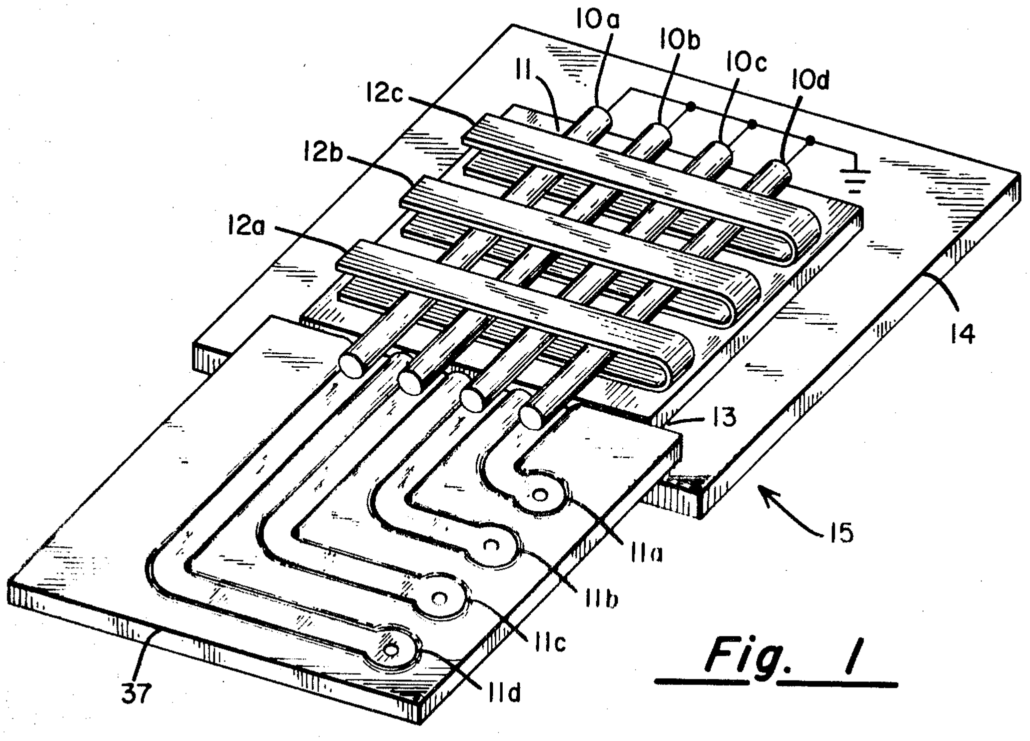
FIG. 1 depicts a conventional plated wire memory embodiment which is connected to the termination device of this invention.

Referring now to FIG. 1 in greater detail, the memory plane 15 comprises a ground plane 14 upon which is mounted an insulator 13 such as glass epoxy whose thickness is approximately 1-mil. The ground plane is conventionally made of 1–14 mil thickness copper but may nevertheless be formed of some other materials such as aluminum. Arranged in parallel fashion and oriented vertically in FIG. 1 are plated magnetic wires **10*a*, 10*b*, 10*c* and 10*d*. The plated wires such as 10a are conventionally 5-mil diameter beryllium copper substrates upon which are coated a magnetic material such as Permalloy. The plated wires 10*a–d* of FIG. 1 are described in U.S. Pat. No. 3,370,929. Positioned orthogonally to the plated wires 10*a–d* are drive straps or word solenoids 12*a*, *b* and *c*. The drive lines 12*a–c*** are conventionally 40-mil wide copper strip positioned upon a flexible insulating member (not shown) and are positioned on 60-mil centers.

The intersection of a particular plated wire such as **10*a* and a particular drive solenoid such as 12*c* comprises a bit position 11 whereat binary information can be stored. In other words, at the position 11 either a binary "0" or a binary "1" is stored depending upon the magnetic orientation of the wire. In the presently known state of the art, the plated wires 10*a–d*** are positioned on 30-mil centers. The spacing between adjacent wires is therefor minimal. Furthermore, 2-mil wire already is being manufactured and it is proposed to position this wire on 10-mil centers. Thus, in the near future it is proposed that there be 5,000 bits such as bit 11 in 1 square inch of area. The ability to reliably and economically connect these closely spaced wires to the outside world via required electronics is of paramount importance. The ability to terminate wires economically and reliably has not been readily accomplished in the past.

As discussed above, certain electronics must be connected to the drive straps **12*a–c* and the plated wires 10*a–d* in order to make the plated memory device operable for use with a digital computer, for example. Thus, the use of drivers connected to the word straps 12*a–c* and bit drivers and sense amplifiers connected to the plated wire 10*a–d*** are omitted for ease of understanding. Such electronics are described, for example, in U.S. Pat. No. 3,465,312.

In normal operation, one end of the plated wires **10*a–d* is grounded to the metal plane 14 and the other end is shown connected to the termination device 37. The electronics described in the last above-mentioned patent are connected to the plated wires 10*a–d* via the termination device 37**. This will be discussed in greater detail hereinafter.

Figure 2:
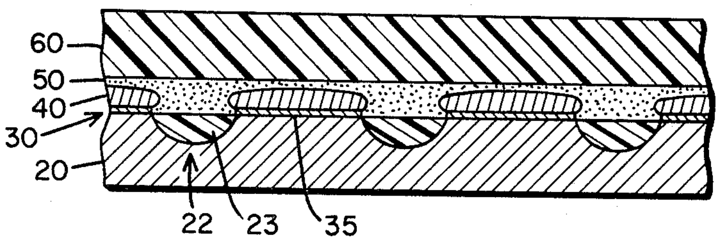
FIG. 2 depicts a cross section of the termination board during its fabrication process.

Reference is now made to FIG. 2 and the method for fabricating the termination device 37 of FIG. 1. Copper stock 20 of approximately 7-mils thickness is utilized initially and a resist such as KPR (Kodak Photo Resist) is applied (not shown) everywhere except where the grooves 22 are to be etched. After the resist is applied to the copper stock 20, it is immersed in an etchant bath such as ferric chloride so that the semicircular grooves 22 are formed. The grooves or channels 22 are approximately 3-mils deep in the embodiment being described. It should be understood from the previous discussion that if the wires 10*a–d* are to be placed on 30-mil centers, the center line of the grooves 22 would be positioned at these centers.

The resist is then removed from the copper substrate 20. The grooves 22 in the copper stock 20 are then filled with an epoxy material 23. If a high temperature insulation is required, an alumina base ceramic adhesive may be used such as CERAMA-DIP 538. The space 35 between the formed grooves 22 which are designated as lands are next electroplated with a very thin (approximately $50 \times 10^{-6}$ inches) film of gold 30. The lands 35 are then electroplated with a 1.3-mil (1 oz.) thickness of copper 40 using a copper pyrophosphate solution. The thickness of copper 40 which is electroplated is determined by the amount of current that is to be carried by the land 35 and therefore can be greater or less than 1 ounce as required. An insulating base 60 of glass epoxy of several mils thickness is next laminated to the copper conductors 40 with an appropriate synthetic rubber adhesive film 50. The adhesive film 50 has a thickness of 2-mils.

Figure 3:
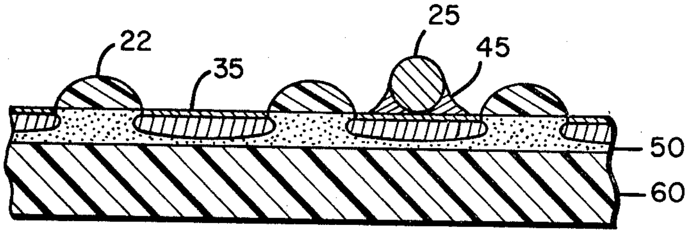
FIG. 3 shows a further cross section of the termination device after fabrication and includes one plated wire memory element in position and connected in place.

The copper stock 20 is then chemically etched with a suitable etchant such as ferric chloride until the film of gold 30 is reached. The film of gold 30 acts as a resist to the copper etchant and automatically controls the etching process. Furthermore, the etchant does not attack the epoxy 23 which fills the channel 22. Therefore, after the last etching step which removes all of the copper stock 20 except where the land is located, the termination device appears as shown in FIG. 3. Thus, the depressed lands 35 are positioned between the insulating epoxy walls 23.

Referring further to FIG. 3, there is shown a plated wire memory element 25 positioned between two of the epoxy insulating walls 23. The plated wire 25 is positioned on the gold plated copper land 35 and is permanently connected thereto by means of the hardened solder 45. It should be appreciated that the solder 45 is in the molten state when it is applied and it can be seen that the non-conducting walls 23 prevents the solder from bridging over into the next adjacent position which would result in a short circuit of two wires which must remain isolated from one another. As a matter of fact, when excess molten solder is applied to the ends of the plated wire the tendency is for the solder to flow a short distance into the channel or land 35 since the solder does not adhere to the epoxy. Therefore, the short circuit bridging effect does not occur.

It should be understood that from the terminating device 37 the plated wires 10*a–d* are connected to various circuits (not shown) such as bit sense amplifiers and bit drivers. The circuits are connected via the terminals 11*a–d*. The terminals 11*a–d* may be adapted to receive wires or as is the convention, the terminals are arranged in a line (either horizontal or vertical) so that a printed circuit board having a plurality of metallic pins can be plugged into the holes provided. An ohmic connection is thereby provided between the printed circuit board containing the bit and sense amplifiers and the plated wires via the lands 35 of the terminal device 37.

It should therefore be clear from the above that the plated wires 10*a–d* can be positioned very close together and soldered to a terminating device 37 without fear of short circuiting adjacent wires by means of a bridging flow of solder.

Although the instant invention has been described with respect to a solder connection, it should be understood that a permanent connection can be made from the plated wire to the land 35 by means of welding techniques. If welding techniques are employed, equipment such as a Hughes Welding Machine can readily be utilized. Still other means can be used to permanently connect the wires to the lands 35 as by pre-tinning the end points of the wires as well as pre-tinning the gold plated lands at the connecting point. Heat is then applied to the respective end points of the wires and the solder electroplated on the lands melts to form a fused joint.

The termination device 37 serves still another useful function. It is often times the practice in the plated wire memory art to connect plated wires in one memory plane to the plated wires in a second memory plane. The reason for having plated wires connected to one another in different planes is that plated wires are conventionally manufactured in 20-inch sections in order to increase their manufacturing yield. Therefore to make a wire of 40, 60 or 80 inch lengths they must be joined together by some expedient. The prior art method of using pin connectors to interconnect wires has not been entirely satisfactory because they are generally not reliable.

Figure 4:
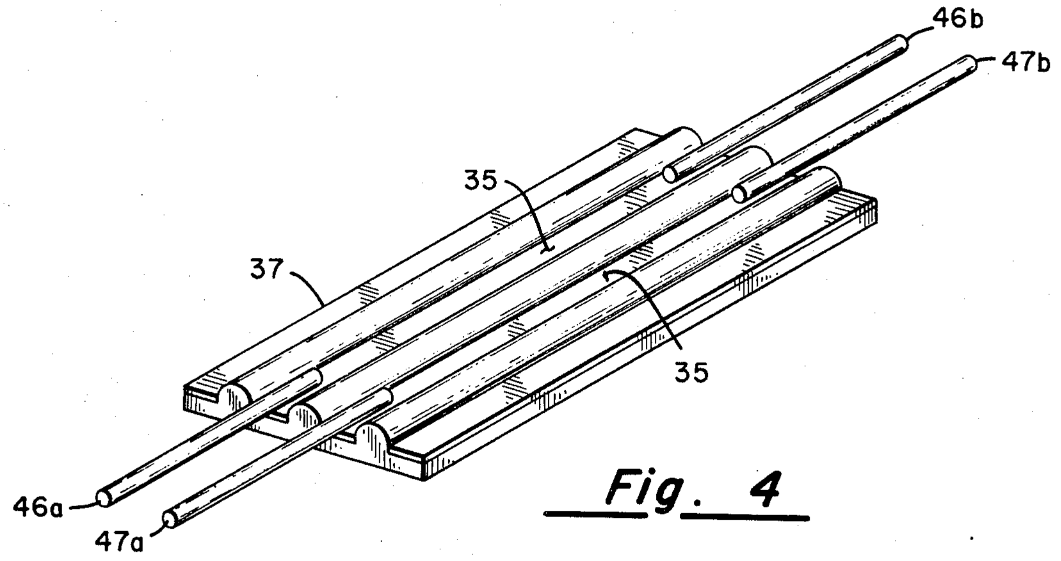
FIG. 4 depicts another embodiment wherein the termination arrangement may be used as an interconnecting means.

By utilizing the terminating arrangement of the instant invention, reliable interconnections can be achieved between different memory planes. This is readily accomplished by making the device 37 so that it is flexible. Flexibility is achieved by making the insulating base 60 of, for example, flexible glass epoxy or a polyimide film (i.e., Kapton). The copper plating solution that is utilized may be either copper sulphate or copper fluoborate. As shown in FIG. 4 the plated wires 46*a* and 47*a* of one plane can be respectively connected to the plated wires 46*b* and 47*b* which are positioned in a second plane. The wires are connected to one another via the lands 35. In other words, the wires are soldered to the lands 35 and the lands also provide the ohmic connection between two designated wires such as 46*a* and 46*b*. The terminating device 37 may be used in this manner when the two planes are at angles to one another so that flexing of the device 37 is required.

Figure 5:
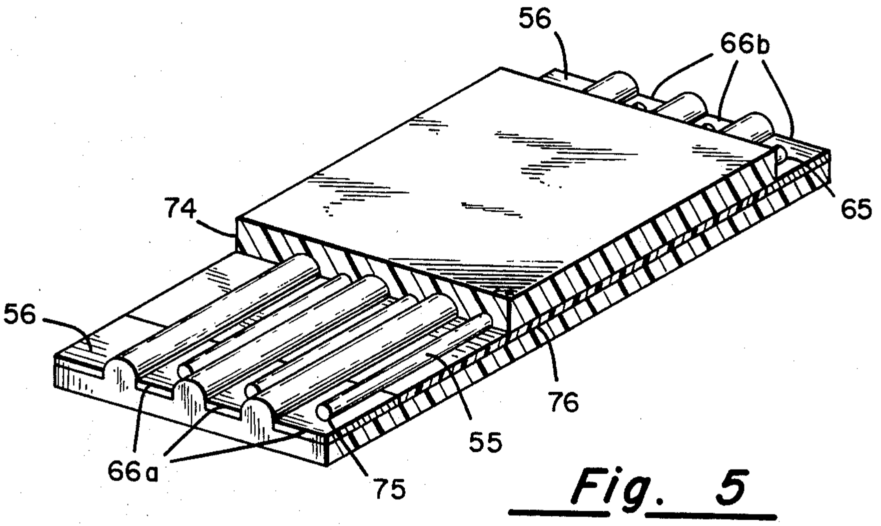
FIG. 5 is another embodiment of this invention wherein resistance wires are positioned within the grooves of the termination device.

Referring now to FIG. 5, there is depicted another arrangement in accordance with this invention whereby resistance wires 55 instead of plated wires may be placed in the channels provided. These resistors are made out of tungsten. The lands in the above resistor arrangement differs however from the land arrangement of FIG. 1–4 in that the copper coating is not continuous. In other words, the lands include copper pads 56 which are utilized for connecting the end points of the wire resistors. The remaining length of the channel is filled with a plastic material 76 such as epoxy. The distance of the copper pads along with the resistance of the wire determines the total value of the resistance value. An epoxy coating 74 is then positioned over the wires both to protect the wires and to keep them in position.

The embodiment described in FIG. 5 is useful in the construction of the memory device described in FIG. 1. Thus in FIG. 1, one end of the plated wires 10*a–d* is shown as being grounded to the metal plane 14. It is sometimes required however to terminate the respective plated wires through a resistor to ground. The device of FIG. 5 is readily utilized for this purpose since the plated wires are positioned and connected at end 66*a* to the same lands that the respective resistors are connected to. The plated wires 10*a–d* are then connected to ground through the ground plane 14 (see FIG. 1) by applying molten solder to the end 66*b* of the resistor pack so that the solder makes an ohmic connection between the lands to which the resistors and plated wires are connected and the ground plane 14. In other words, a continuous electrical circuit is provided between the terminal ends 11*a–d*, (see FIG. 1), the plated wires 10*a–d*, the resistors 55 (FIG. 5) to the ground plane 14. The other end of the plated wires 10*a–d* as above mentioned are connected through the termination device 37 to bit drivers and sense amplifiers via the terminals 11*a–d*.

The embodiments of the invention in which an exclusive property or privilege is claimed are defined as follows:

1. The method of fabricating a high density connecting device for wire devices comprising the steps of:
   a. forming a plurality of parallel grooves in a relatively thin piece of metal stock;
   b. filling said grooves with an insulating material;
   c. forming a first metallic coating which acts as a resist upon said stock except where said grooves are formed;
   d. adding a second metallic coating upon said first metallic coating with a thickness to form a plurality of current carrying conductors;
   e. fixing a substantially flat substrate over said second metallic coating;
   f. removing said metal stock from the underside of said grooves to expose the insulating material in said grooves and said first metallic coating so as to form insulating walls, the area between two contiguous walls forming a depressed land for connecting one said wire device.

2. The method of fabricating a connecting device in accordance with claim 1 wherein said metal stock is copper.

3. The method of fabricating a connecting device in accordance with claim 1 wherein said grooves are filled with an epoxy material.

4. The method of fabricating a connecting device in accordance with claim 1 wherein said first metallic coating is formed by electroplating a layer of gold everywhere except where said grooves are formed.

5. The method of fabricating a connecting device in accordance with claim 1 wherein said second metallic coating is formed by electroplating a layer of copper on said first metallic coating.

6. The method of fabricating a connecting device in accordance with claim 1 which is flexible.

* * * * *